(12) United States Patent
Kreso

(10) Patent No.: US 7,076,953 B2
(45) Date of Patent: Jul. 18, 2006

(54) METHOD FOR CONTROLLING AN ENGINE WITH VGT AND EGR SYSTEMS

(75) Inventor: Admir Kreso, Canton, MI (US)

(73) Assignee: Detroit Diesel Corporation, Detroit, MI (US)

( * ) Notice: Subject to any disclaimer, the term of this patent is extended or adjusted under 35 U.S.C. 154(b) by 448 days.

(21) Appl. No.: 10/474,883

(22) PCT Filed: Sep. 19, 2002

(86) PCT No.: PCT/US02/29782

§ 371 (c)(1),
(2), (4) Date: Oct. 15, 2003

(87) PCT Pub. No.: WO2004/027235

PCT Pub. Date: Apr. 1, 2004

(65) Prior Publication Data

US 2004/0177309 A1   Sep. 9, 2004

(51) Int. Cl.
*F02B 33/44* (2006.01)
(52) U.S. Cl. ............................... 60/605.2; 123/568.11; 123/568.21
(58) Field of Classification Search ............... 60/605.1, 60/605.2; 123/568.11, 568.12, 568.16, 568.21
See application file for complete search history.

(56) References Cited

U.S. PATENT DOCUMENTS

| | | | |
|---|---|---|---|
| 6,178,749 B1 | 1/2001 | Kolmanovsky et al. | |
| 6,305,167 B1 | 10/2001 | Weismann, II et al. | |
| 6,347,519 B1 | 2/2002 | Kreso | |
| 6,422,219 B1 * | 7/2002 | Savonen et al. | 123/568.12 |
| 6,457,461 B1 * | 10/2002 | Romzek | 123/568.16 |
| 6,460,522 B1 * | 10/2002 | Rimnac | 123/568.24 |

\* cited by examiner

*Primary Examiner*—Hoang Nguyen
(74) *Attorney, Agent, or Firm*—Brooks Kushman P.C.

(57) ABSTRACT

A method for controlling an internal combustion engine is provided. The engine includes a variable geometry turbocharger (VGT) system and an exhaust gas recirculation (EGR) system. In a boost mode, the VGT system is controlled with a closed loop based on boost pressure. In an EGR mode, the VGT system is controlled with a closed loop based on EGR rate. Further, in the EGR mode, the EGR system is controlled with a closed loop based on boost pressure. Preferred control techniques are also provided including non-linear compensation and adaptive feed forward control.

16 Claims, 2 Drawing Sheets

METHOD FOR CONTROLLING AN ENGINE WITH VGT AND EGR SYSTEMS

BACKGROUND OF THE INVENTION

1. Field of the Invention

The present invention relates to a method for controlling an internal combustion engine including a variable geometry turbocharger (VGT) system and an exhaust gas recirculation (EGR) system.

2. Background Art

In the control of internal combustion engines, the conventional practice utilizes an engine controller with inputs, outputs, and a processor that executes instructions to control the engine including its various systems. The engine may include a variable geometry turbocharger (VGT) system and an exhaust gas recirculation (EGR) system. U.S. Pat. No. 6,305,167 describes an existing method of controlling an engine.

The engine business is quite competitive. Increasing demands are being placed on manufacturers to provide improved performance, reliability, and durability while meeting increasing emissions requirements. For the foregoing reasons, there is a need for an improved method for controlling an engine.

SUMMARY OF THE INVENTION

It is, therefore, an object of the present invention to provide an improved method for controlling an engine with VGT and EGR systems.

In carrying out the object, a method for controlling an internal combustion engine is provided. The engine includes an engine block defining a plurality of cylinders, a controller, a variable geometry turbocharger (VGT) system and an exhaust gas recirculation (EGR) system. The VGT system provides pressurized intake air to the plurality of cylinders. The EGR system provides a metered portion of the exhaust gases to the plurality of cylinders. The controller communicates with the VGT system and the EGR system to control the engine. The method comprises selecting an engine operating mode from a plurality of modes including a boost mode and an EGR mode. When the selected engine operating mode is the boost mode, the VGT system is controlled with a closed loop based on a desired boost pressure and a measured boost pressure such that the measured boost pressure tracks the desired boost pressure. When the selected engine operating mode is the EGR mode, the VGT system is controlled with a closed loop based on a desired EGR rate and a measured EGR rate such that the measured EGR rate tracks the desired EGR rate. Further, in the EGR mode, the EGR system is controlled with a closed loop based on a desired boost pressure and a measured boost pressure such that the measured boost pressure tracks the desired boost pressure.

In a preferred embodiment, when the selected engine operating mode is the boost mode, controlling the VGT system with the closed loop further comprises comparing the desired boost pressure to the measured boost pressure to determine an error signal. The error signal is processed to determine a commanded VGT position. An adaptive feed forward VGT position map is utilized to determine a feed forward VGT position. The VGT system is controlled based on the commanded VGT position and the feed forward VGT position. More preferably, processing the error signal further comprises utilizing a non-linear compensation map to determine a compensated error signal based on the error signal. A linear controller is utilized to determine the commanded VGT position based on the compensated error signal.

Further, in the preferred embodiment, when the selected engine operating mode is the EGR mode, controlling the VGT system with the closed loop further comprises comparing the desired EGR rate to the measured EGR rate to determine an error signal. The error signal is processed to determine a commanded VGT position. An adaptive feed forward VGT position map is utilized to determine a feed forward VGT position. The VGT system is controlled based on the commanded VGT position and the feed forward VGT position. More preferably, processing the error signal further comprises utilizing a non-linear compensation map to determine a compensated error signal based on the error signal. A linear controller is utilized to determine the commanded VGT position based on the compensated error signal.

Further, in the preferred embodiment, when the selected engine operating mode is the EGR mode, controlling the EGR system with the closed loop further comprises comparing the desired boost pressure to the measured boost pressure to determine an error signal. The error signal is processed to determine a commanded EGR position. A feed forward EGR position map is utilized to determine a feed forward EGR position. The EGR system is controlled based on the commanded EGR position and the feed forward EGR position. More preferably, processing the error signal further comprises utilizing a non-linear compensation map to determine a compensated error signal based on the error signal. A linear controller is utilized to determine the commanded EGR position based on the compensated error signal.

It is appreciated that although methods of the present invention comprise controlling the VGT system with a closed loop when boost mode is selected, and controlling the VGT system and the EGR system with closed loops when EGR mode is selected, certain special engine conditions during boost mode and/or EGR mode may require alternative control techniques during these special instances without departing from the scope of the present invention. For example, in the preferred embodiment, controlling the EGR system further comprises controlling the EGR system based solely on the feed forward EGR position when the feed forward EGR position is a full open position or a full closed position. For all other feed forward EGR positions aside from the full open position and the full closed position, in the preferred embodiment, closed loop control based on boost pressure is still used. Further, methods of the present invention are suitable for many different engine types.

Further, in carrying out the present invention, an internal combustion engine is provided. The engine includes an engine block defining a plurality of cylinders, a controller, a variable geometry turbocharger (VGT) system and an exhaust gas recirculation (EGR) system. The VGT system provides pressurized intake air to the plurality of cylinders. The EGR system provides a metered portion of the exhaust gases to the plurality of cylinders. The controller communicates with the VGT system and the EGR system to control the engine. The controller is programmed to control the internal combustion engine by selecting an engine operating mode from a plurality of modes including a boost mode and an EGR mode. When the selected engine operating mode is the boost mode, the VGT system is controlled with a closed loop based on a desired boost pressure and measured boost pressure such that the measured boost pressure tracks the desired boost pressure. When the selected engine operating mode is the EGR mode, the VGT system is controlled with a closed loop based on a desired EGR rate and a measured EGR rate such that the measured EGR rate tracks the desired EGR rate. Further, when the selected engine operating mode is the EGR mode, the EGR system is controlled with a closed loop based on a desired boost pressure and a measured boost pressure such that the measured boost pressure tracks the desired boost pressure.

In a preferred embodiment, when the selected engine operating mode is the boost mode, controlling the VGT system with the closed loop further comprises comparing the desired boost pressure to the measured boost pressure to determine an error signal. The error signal is processed to determine a commanded VGT position. An adaptive feed forward VGT position map is utilized to determine a feed forward VGT position. The VGT system is controlled based on the commanded VGT position and the feed forward VGT position. More preferably, processing the error signal further comprises utilizing a non-linear compensation map to determine a compensated error signal based on the error signal. A linear controller is utilized to determine the commanded VGT position based on the compensated error signal.

Further, in the preferred embodiment, when the selected engine operating mode is the EGR mode, controlling the VGT system with the closed loop further comprises comparing the desired EGR rate to the measured EGR rate to determine an error signal. The error signal is processed to determine a commanded VGT position. An adaptive feed forward VGT position map is utilized to determine a feed forward VGT position. The VGT system is controlled based on the commanded VGT position and the feed forward VGT position more preferably, processing the error signal further comprises utilizing a non-linear compensation map to determine a compensated error signal based on the error signal. A linear controller is utilized to determine the commanded VGT position based on the compensated error signal.

Further, in the preferred embodiment, when the selected engine operating mode is the EGR mode, controlling the EGR system with the closed loop further comprises comparing the desired boost pressure to the measured boost pressure to determine an error signal. The error signal is processed to determine a commanded EGR position. A feed forward EGR position map is utilized to determine a feed forward EGR position. The EGR system is controlled based on the commanded EGR position and the feed forward EGR position. More preferably, processing the error signal further comprises utilizing a non-linear compensation map to determine a compensated error signal based on the error signal. A linear controller is utilized to determine the commanded EGR position based on the compensated error signal.

Further, in the preferred embodiment, controlling the EGR system further comprises controlling the EGR system based solely on the feed forward EGR position when the feed forward EGR position is a full open position or a full closed position.

The above object and other objects, features, and advantages of the present invention are readily apparent from the following detailed description of the preferred embodiment when taken in connection with the accompanying drawings.

DETAILED DESCRIPTION OF THE PREFERRED EMBODIMENT

Figure 1:
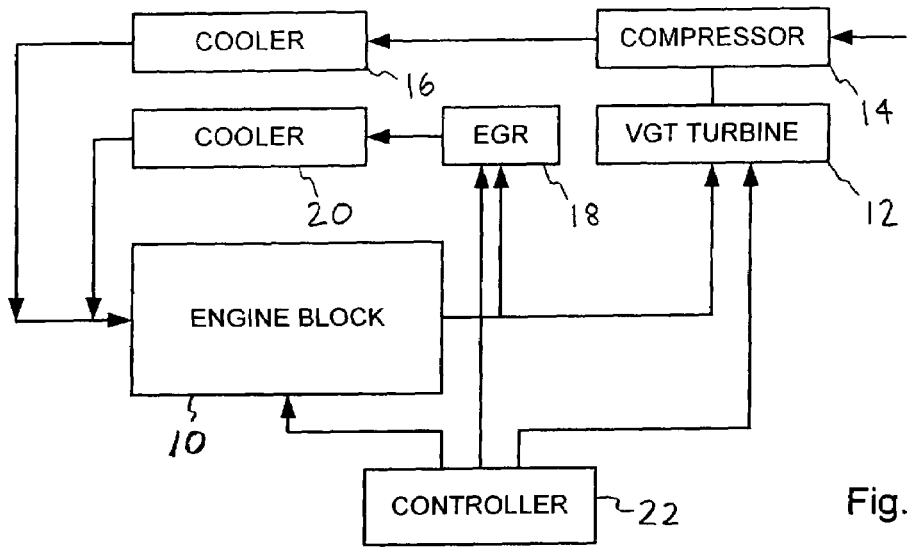
FIG. 1 is a diagram that illustrates an internal combustion engine with VGT and EGR systems in the preferred embodiment of the present invention.

FIG. 1 illustrates an internal combustion engine including an engine block 10 defining a plurality of cylinders, with each cylinder receiving fuel from a fuel injector. In a preferred embodiment, the internal combustion engine is a compression-ignition internal combustion engine, such as a heavy duty diesel fuel engine. The engine includes a VGT system for providing pressurized intake air to the plurality of cylinders. VGT turbine 12, compressor 14, and cooler 16 compose the VGT system. The pressure of the engine exhaust gases causes VGT turbine 12 to spin. VGT turbine 12 drives compressor 14. Compressor 14 pressurizes intake air to develop increased power during combustion. Charge air cooler 16 cools the pressurized air. The VGT system has moveable components that can change the turbocharger geometry by changing the area or areas in the turbine stage to which exhaust gases flow, and/or changing the angle at which the exhaust gases enter or leave the turbine. The turbocharger supplies varying amounts of turbo boost pressure depending on the turbocharger geometry. The VGT system in embodiments of the present invention may take any suitable form. For example, a variable inlet nozzle to the turbine, a moveable sidewall in the turbine housing, or any other controllable air pressurizing device including the above examples, and including a modulated wastegate valve may compose the VGT system.

EGR valve 18 and cooler 20 compose the EGR system. The EGR system introduces a metered portion of the exhaust gases into the intake manifold. The exhaust gases lower combustion temperatures to reduce the level of oxides of nitrogen ($NO_x$) that are produced. In embodiments of the present invention, the EGR system may take any suitable form. For example, a butterfly valve is a suitable EGR valve.

With continuing reference to FIG. 1, the engine also includes a controller 22. Controller 22 communicates with the VGT system and the EGR system to control the engine. Controller 22 may take any suitable form. A suitable controller includes a programmed microprocessor. In operation, controller 22 receives signals from the various vehicle sensors and executes programmed logic embedded in hardware and/or software to control the engine.

Figure 2:
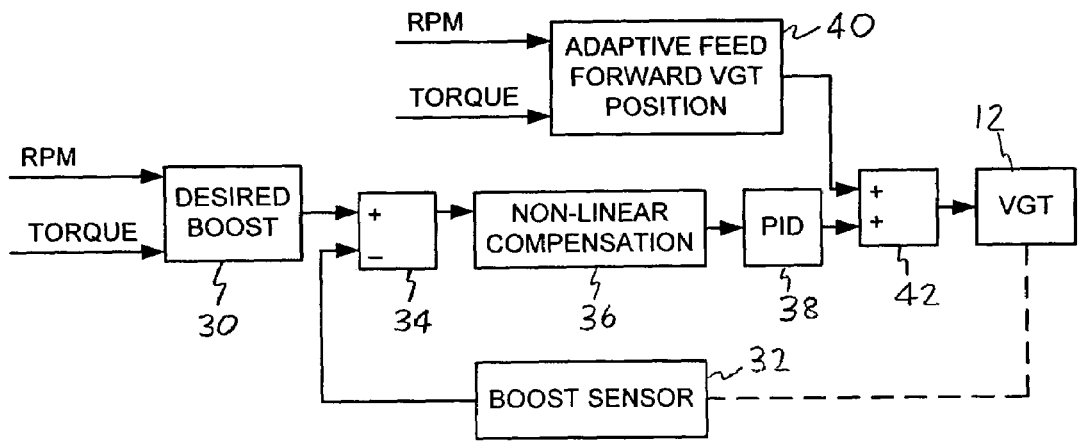
FIG. 2 is a diagram that illustrates VGT system control in the boost mode.
Figure 3:
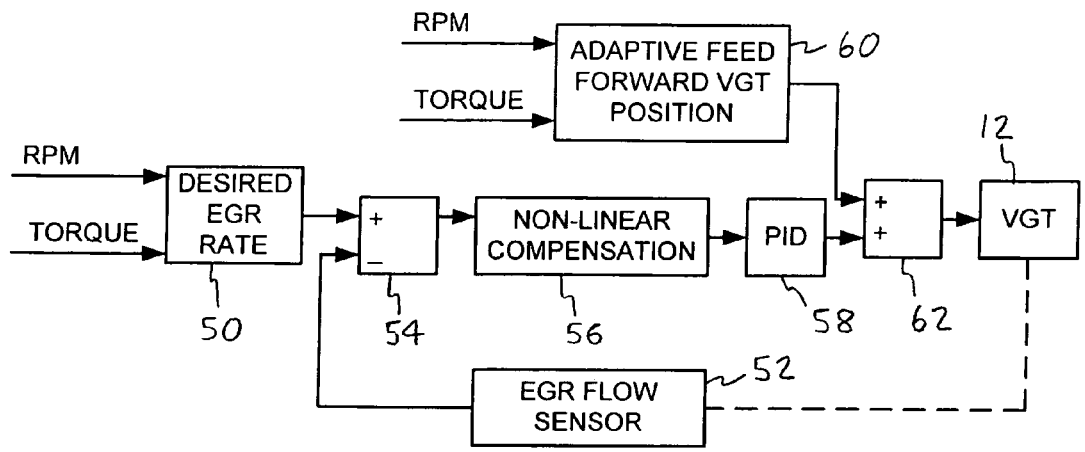
FIG. 3 is a diagram that illustrates VGT system control in the EGR mode.
Figure 4:
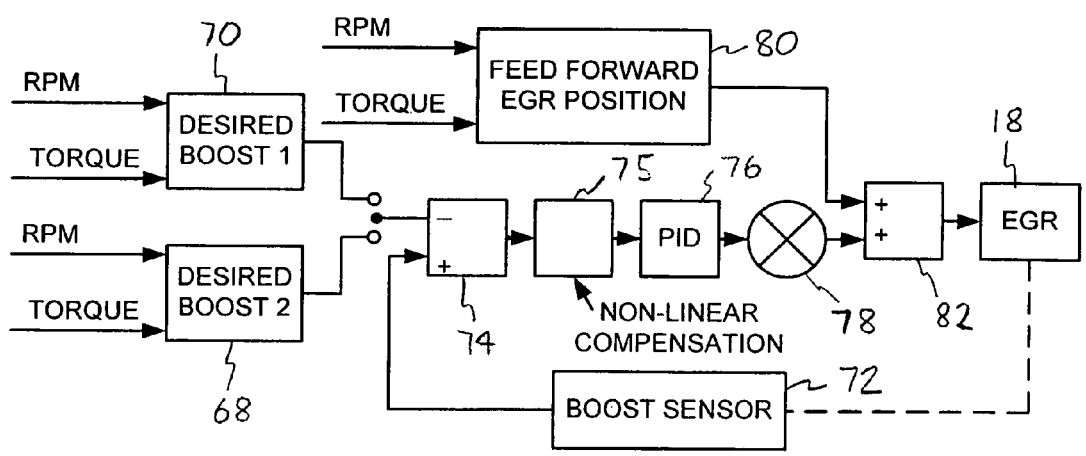
FIG. 4 is a diagram that illustrates EGR system control in the EGR mode.

FIGS. 2–4 illustrate VGT system and EGR system control in the preferred embodiment. Generally, the VGT system provides pressurized intake air to the engine cylinders, and the EGR system provides a metered portion of the exhaust gases to the engine cylinders. The turbo boost pressure results in increased power while the introduction of exhaust gases lowers combustion temperatures. Controller 22 operates the engine and controls the VGT system and EGR system in accordance with the current engine operating mode which is based on any number of engine conditions. The plurality of available engine operating modes includes a boost mode and an EGR mode. FIG. 2 illustrates VGT system control in the boost mode.

A desired boost pressure is determined based on engine speed and demanded torque at desired boost pressure map 30. Boost sensor 32 determines a measured boost pressure. Summer 34 compares the desired boost pressure to the measured boost pressure to determine an error signal. A non-linear compensation map 36 determines a compensated error signal based on the input error signal. A linear controller such as proportional/integral/derivative controller 38 determines a commanded VGT position based on the compensated error signal. An adaptive feed forward VGT position map 40 determines a feed forward VGT position based on engine speed and torque. Summer 42 controls the VGT system based on the commanded VGT position from PID controller 38 and the feed forward VGT position from adaptive feed forward VGT position map 40. The closed loop VGT system control causes the measured boost pressure from boost sensor 32 to track the desired boost pressure from desired boost pressure map 30. VGT system control shown in FIG. 2 is used in the boost mode, when the EGR valve is fully closed. VGT system control when the EGR valve is fully open or partially open is shown in FIG. 3. EGR system control is shown in FIG. 4.

With continuing reference to FIG. 2, the purpose of the feed forward VGT position is to give a close approximation of what state the VGT should be in to achieve the target boost. Initially, the feed forward map is calibrated with values that will achieve the target boost at each specific engine speed and torque. The adapting feature of the feed forward logic is used to compensate for turbo-to-turbo and engine-to-engine variability. While the engine is operating in pseudo-steady state, values in the feed forward table are updated based on actual controller output values.

Because the VGT system is a non-linear system that will respond differently depending on engine speed and torque, non-linear compensation logic 36 determines a compensated error signal. The non-linear compensation map maps a boost pressure error to a VGT position error. Specifically, the map receives a boost pressure error as input and divides the input value by a table value representing the first derivative of boost pressure with respect to VGT position command. The table is indexed by engine speed and torque. One suitable technique to populate the table is to run an engine at steady state for all engine speed and torque combinations, and slew the VGT position command over a reasonable range and record the change in boost pressure.

FIG. 3 illustrates VGT system control in the EGR mode. The VGT system is controlled with a closed loop based on the desired EGR rate and the measured EGR rate such that the measured EGR rate tracks the desired EGR rate. The desired EGR rate is determined from a desired EGR rate map 50 based on engine speed and torque. The measured EGR rate is determined by EGR flow sensor 52. Summer 54 compares the desired EGR rate from map 50 to the measured EGR rate from EGR flow sensor 52 to determine an error signal. A non-linear compensation map 56 is utilized to determine a compensated error signal based on the error signal from summer 54. A linear controller such as proportional/integral/derivative controller 58 determines the commanded VGT position based on the compensated error signal. An adaptive feed forward VGT position map 60 is utilized to determine a feed forward position based on engine speed and torque. Summer 62 provides a signal to control the VGT system based on the commanded VGT position from PID 58 and the feed forward VGT position from adaptive feed forward VGT position map 60.

Similar techniques as those described previously with respect to FIG. 2 are utilized to update table values for adaptive feed forward VGT position map 60 and determine table values for non-linear compensation map 56. While the engine is operating in pseudo-steady state, values in the feed forward table are updated based on actual controller output values. The non-linear compensation map 56 maps EGR flow rate error to VGT position error. By running an engine at steady state for all engine speed and torque combinations and slewing VGT position command over a reasonable range and then recording changes in EGR flow rate, the table may be calibrated.

FIG. 4 illustrates EGR system control in the EGR mode. The EGR system is controlled with a closed loop based on a desired boost pressure and a measured boost pressure such that the measured boost pressure tracks the desired boost pressure. Desired boost pressure is determined as a function of values from desired boost maps 68 and 70. The desired boost may be taken from one table or the other depending on engine conditions, or may be a weighted average of values from both tables. Summer 74 compares desired boost pressure to measured boost pressure from boost pressure sensor 72. Non-linear compensation map 75 is calibrated with values that map boost error to EGR valve position error. This map may be calibrated by running the engine at steady state and slewing EGR position command through a reasonable range, at recording boost changes. The output of non-linear compensation map 75 is a compensated error signal and a linear controller such as proportional/integral/derivative controller 76 determines the commanded EGR position based on the compensated error signal. A feed forward EGR position map 80 determines a feed forward EGR position. Map 80 optionally may be adaptive. The EGR system is controlled based on the command of the EGR position from PID 76 and the feed forward EGR position from feed forward EGR position map 80. To increase transient engine performance, a rapid transition from closed to open loop control over the EGR valve position may be used. Switch 78 selectively blocks the output of PID controller 76 when open loop control is desired. Examples of engine conditions where open loop EGR valve control would be used include when the EGR valve is commanded to fully closed or to fully open. Other positions for the EGR valve generally utilized closed loop EGR system control of FIG. 4 and closed loop VGT system controller of FIG. 3.

In operation of the engine, the control systems shown in FIGS. 2–4 cooperate to control the VGT system and the EGR system. In the boost mode, the EGR valve is fully closed preferably by a direct command from feed forward EGR position map 80 with switch 78 blocking the output of PID 76 as shown in FIG. 4. With the EGR valve fully closed, the VGT system is controlled with closed loop control around boost pressure as shown in FIG. 2, and turbocharger geometry is varied to control air flow through the turbine and achieve a desired boost pressure. In the EGR mode, FIG. 3 illustrates that the VGT system is controlled with closed loop based on EGR flow rate. Air flow through the VGT system is controlled such that the desired EGR flow rate is achieved. At the same time, EGR valve position is controlled in closed loop fashion based on boost pressure as shown in FIG. 4.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for controlling an internal combustion engine, the engine including an engine block defining a plurality of cylinders, a controller, a variable geometry turbocharger (VGT) system and an exhaust gas recirculation (EGR) system, the VGT system providing pressurized intake air to the plurality of cylinders and the EGR system providing a metered portion of the exhaust gases to the plurality of cylinders, the controller communicating with the VGT system and the EGR system to control the engine, the method comprising:

selecting an engine operating mode from a plurality of modes including a boost mode and an EGR mode;

when the selected engine operating mode is the boost mode, controlling the VGT system with a closed loop based on a desired boost pressure and a measured boost pressure such that the measured boost pressure tracks the desired boost pressure; and when the selected engine operating mode is the EGR mode, controlling the VGT system with a closed loop based on a desired EGR rate and a measured EGR rate such that the measured EGR rate tracks the desired EGR rate, and controlling the EGR system with a closed loop based on a desired boost pressure and a measure boost pressure such that the measured boost pressure tracks the desired boost pressure.

2. The method of claim 1 wherein when the selected engine operating mode is the boost mode, controlling the VGT system with the closed loop further comprises:

comparing the desired boost pressure to the measured boost pressure to determine an error signal;

processing the error signal to determine a commanded VGT position;

utilizing an adaptive feed forward VGT position map to determine a feed forward VGT position; and controlling the VGT system based on the commanded VGT position and the feed forward VGT position.

3. The method of claim 2 wherein processing the error signal further comprises:

utilizing a non-linear compensation map to determine a compensated error signal based on the error signal; and utilizing a linear controller to determine the commanded VGT position based on the compensated error signal.

4. The method of claim 1 wherein when the selected engine operating mode is the EGR mode, controlling the VGT system with the closed loop further comprises:

comparing the desired EGR rate to the measured EGR rate to determine an error signal;

processing the error signal to determine a commanded VGT position;

utilizing an adaptive feed forward VGT position map to determine a feed forward VGT position; and controlling the VGT system based on the commanded VGT position and the feed forward VGT position.

5. The method of claim 4 wherein processing the error signal further comprises:

utilizing a non-linear compensation map to determine a compensated error signal based on the error signal; and utilizing a linear controller to determine the commanded VGT position based on the compensated error signal.

6. The method of claim 1 wherein when the selected engine operating mode is the EGR mode, controlling the EGR system with the closed loop further comprises:

comparing the desired boost pressure to the measured boost pressure to determine an error signal;

processing the error signal to determine a commanded EGR position;

utilizing a feed forward EGR position map to determine a feed forward EGR position; and controlling the EGR system based on the commanded EGR position and the feed forward EGR position.

7. The method of claim 6 wherein processing the error signal further comprises:

utilizing a non-linear compensation map to determine a compensated error signal based on the error signal; and utilizing a linear controller to determine the commanded EGR position based on the compensated error signal.

8. The method of claim 6 wherein controlling the EGR system further comprises:

controlling the EGR system based solely on the feed forward EGR position when the feed forward EGR position is a full open position or a full closed position.

9. An internal combustion engine, the engine including an engine block defining a plurality of cylinders, a controller, a variable geometry turbocharger (VGT) system and an exhaust gas recirculation (EGR) system, the VGT system providing pressurized intake air to the plurality of cylinders and the EGR system providing a metered portion of the exhaust gases to the plurality of cylinders, the controller communicating with the VGT system and the EGR system to control the engine, the controller being programmed to control the internal combustion engine by:

selecting an engine operating mode from a plurality of modes including a boost mode and an EGR mode;

when the selected engine operating mode is the boost mode, controlling the VGT system with a closed loop based on a desired boost pressure and a measured boost pressure such that the measured boost pressure tracks the desired boost pressure; and when the selected engine operating mode is the EGR mode, controlling the VGT system with a closed loop based on a desired EGR rate and a measured EGR rate such that the measured EGR rate tracks the desired EGR rate, and controlling the EGR system with a closed loop based on a desired boost pressure and a measure boost pressure such that the measured boost pressure tracks the desired boost pressure.

10. The engine of claim 9 wherein when the selected engine operating mode is the boost mode, controlling the VGT system with the closed loop further comprises:

comparing the desired boost pressure to the measured boost pressure to determine an error signal;

processing the error signal to determine a commanded VGT position;

utilizing an adaptive feed forward VGT position map to determine a feed forward VGT position; and controlling the VGT system based on the commanded VGT position and the feed forward VGT position.

11. The engine of claim 10 wherein processing the error signal further comprises:

utilizing a non-linear compensation map to determine a compensated error signal based on the error signal; and utilizing a linear controller to determine the commanded VGT position based on the compensated signal.

12. The engine of claim 9 wherein when the selected engine operating mode is the EGR mode, controlling the VGT system with the closed loop further comprises:

comparing the desired EGR rate to the measured EGR rate to determine an error signal;

processing the error signal to determine a commanded VGT position;

utilizing an adaptive feed forward VGT position map to determine a feed forward VGT position; and controlling the VGT system based on the commanded VGT position and the feed forward VGT position.

13. The engine of claim 12 wherein processing the error signal further comprises:

utilizing a non-linear compensation map to determine a compensated error signal based on the error signal; and utilizing a linear controller to determine the commanded VGT position based on the compensated error signal.

14. The engine of claim 9 wherein when the selected engine operating mode is the EGR mode, controlling the EGR system with the closed loop further comprises:

comparing the desired boost pressure to the measured boost pressure to determine an error signal;

processing the error signal to determine a commanded EGR position;

utilizing a feed forward EGR position map to determine a feed forward EGR position; and controlling the EGR system based on the commanded EGR position and the feed forward EGR position.

15. The engine of claim 14 wherein processing the error signal further comprises:

utilizing a non-linear compensation map to determine a compensated error signal based on the error signal; and utilizing a linear controller to determine the commanded EGR position based on the compensated error signal.

16. The engine of claim 14 wherein controlling the EGR system further comprises:

controlling the EGR system based solely on the feed forward EGR position when the feed forward EGR position is a full open position or a full closed position.

* * * * *